United States Patent
Lee et al.

(10) Patent No.: US 8,816,496 B2
(45) Date of Patent: Aug. 26, 2014

(54) THERMAL LOADING MECHANISM

(75) Inventors: Ted Lee, Federal Way, WA (US);
Tejinder Pal S. Aulakh, Auburn, WA (US)

(73) Assignee: Intel Corporation, Santa Clara, CA (US)

( * ) Notice: Subject to any disclaimer, the term of this patent is extended or adjusted under 35 U.S.C. 154(b) by 261 days.

(21) Appl. No.: 12/978,340

(22) Filed: Dec. 23, 2010

(65) Prior Publication Data

US 2012/0162923 A1    Jun. 28, 2012

(51) Int. Cl.
*H01L 23/34*    (2006.01)
*H05K 7/20*    (2006.01)
*F28F 7/00*    (2006.01)

(52) U.S. Cl.
USPC ........... 257/719; 257/722; 361/709; 361/714; 361/719; 165/80.3; 174/16.3

(58) Field of Classification Search
USPC .............. 361/679.46–679.54, 688–723; 257/712–722
See application file for complete search history.

(56) References Cited

U.S. PATENT DOCUMENTS

| | | |
|---|---|---|
| 4,560,217 A | 12/1985 | Siano |
| 6,101,091 A | 8/2000 | Baik |
| 6,159,031 A | 12/2000 | Llapitan et al. |
| 6,327,147 B1 | 12/2001 | Llapitan et al. |
| 6,585,534 B2 | 7/2003 | Llapitan et al. |
| 6,657,868 B1 | 12/2003 | Hsue |
| 6,699,057 B2 * | 3/2004 | Ma ................. 439/342 |
| 6,722,908 B2 | 4/2004 | Llapitan et al. |
| 6,762,932 B2 | 7/2004 | Regimbal et al. |
| 6,847,521 B2 | 1/2005 | Beall et al. |
| 6,860,693 B2 | 3/2005 | Jones et al. |
| 6,930,884 B2 | 8/2005 | Cromwell et al. |
| 7,029,310 B1 * | 4/2006 | Perez et al. ............ 439/331 |
| 7,126,828 B2 | 10/2006 | Beall et al. |
| 7,147,483 B1 | 12/2006 | Ju |
| 7,203,067 B2 | 4/2007 | Beall et al. |
| 7,252,517 B2 | 8/2007 | Ju |
| 7,371,100 B1 | 5/2008 | Polnyi |
| 7,453,707 B2 | 11/2008 | Beall et al. |
| 7,455,526 B1 | 11/2008 | Ila et al. |
| 7,471,517 B1 | 12/2008 | Desrosiers et al. |
| 7,604,486 B2 * | 10/2009 | Martinson et al. ......... 439/70 |
| 7,623,344 B2 | 11/2009 | Beall et al. |
| 7,867,003 B2 | 1/2011 | Llapitan et al. |
| 7,988,459 B2 * | 8/2011 | Ulen et al. ............... 439/73 |
| 8,081,489 B2 | 12/2011 | Llapitan et al. |

(Continued)

OTHER PUBLICATIONS

International Search Report and Written Opinion for International Application No. PCT/US2011/067042, dated Aug. 28, 2012, 11 pp. [77.221PCT (ISR & WO)].

*Primary Examiner* — Zachary M Pape
(74) *Attorney, Agent, or Firm* — Konrad Raynes Davda & Victor LLP; Alan S. Raynes

(57) ABSTRACT

Electronic assemblies and methods are described. One embodiment includes a circuit board and a socket coupled to the circuit board. The assembly also includes a package positioned in the socket, the package including a substrate, a die, and a heat spreader, the die positioned between the substrate and the heat spreader. The assembly also includes a load plate positioned on the heat spreader, the load plate covering a majority of the heat spreader, the load plate applying a force to the heat spreader that couples the package to the socket. Other embodiments are described and claimed.

20 Claims, 5 Drawing Sheets

(56) References Cited

U.S. PATENT DOCUMENTS

| | | | |
|---|---|---|---|
| 8,279,606 B2* | 10/2012 | Kyle | 361/709 |
| 2005/0197436 A1* | 9/2005 | Czubarow | 524/405 |
| 2005/0208813 A1* | 9/2005 | Trout et al. | 439/326 |
| 2006/0034059 A1* | 2/2006 | Luo | 361/704 |
| 2008/0081489 A1 | 4/2008 | MacGregor et al. | |
| 2008/0230893 A1 | 9/2008 | Too et al. | |
| 2008/0290502 A1* | 11/2008 | Kutlu | 257/713 |
| 2009/0021917 A1* | 1/2009 | Floyd et al. | 361/719 |
| 2009/0197454 A1* | 8/2009 | Liao | 439/331 |
| 2009/0203245 A1* | 8/2009 | Chiang | 439/331 |
| 2010/0099294 A1* | 4/2010 | Yeh | 439/366 |

* cited by examiner

THERMAL LOADING MECHANISM

RELATED ART

An integrated circuit (IC) package is used to electrically couple an IC die to external components and circuitry. The IC package typically includes one or more die structures (for example, a silicon chip) coupled to a package substrate, with electrical contacts from the die coupled to electrical contacts on one side of the package substrate, which are in turn electrically coupled to external contacts on the other side of the package substrate. The external contacts of the package may include any suitable structure, including, but not limited to, pins and solder bumps arranged in any suitable pattern.

The external contacts of an IC package may be mounted directly to the electrical contacts of a structure such as a printed circuit board (for example, a motherboard). Alternatively, sockets have been devised to attach an IC package to electrical contacts of a board. The sockets may be designed to permit the IC package to be removed from the board. For example, electrical contacts of an IC package may be removably coupled to first contacts of a socket, and second contacts of the socket may be coupled to a board. The socket may also be configured to accept a heat sink structure positioned on the IC package to transmit heat away from the package.

In order to ensure a suitable electrical contact between an IC package and the socket contacts, some architectures require the application of a force to press the contacts of the socket against corresponding contacts of the package. If the force is not within a specified range pertinent to the socket, this may cause undesirable stresses in the system, leading to damage in the IC package, the socket, the package/socket interface, and/or the socket/board interface.

BRIEF DESCRIPTION OF THE DRAWINGS

Embodiments are described by way of example, with reference to the accompanying drawings, wherein.

DETAILED DESCRIPTION

Certain embodiments relate to electronic assemblies and mechanisms for applying a force to an electronic component.

A load mechanism may be used to apply a load force to a package so that the package can make electrical contact with the contacts on a socket coupled to a circuit board. Existing load mechanism structures have applied the load force to a heat spreader structure positioned on a die in a package. The heat spreader acts to transfer heat away from the die. The load is typically applied along perimeter regions of the heat spreader. The load travels though the heat spreader to the die. A thermal interface material is typically positioned between the heat spreader and the die.

For large sized packages, problems may arise related to the flatness of the heat spreader. Such problems are caused when the application of load to the perimeter of the heat spreader causes the perimeter to bend relative to more central regions of the heat spreader. This can have a negative impact on thermal properties because portions of the heat spreader may pull away from the die, causing a poor thermal coupling between the die and heat spreader and degradation of the thermal interface material therebetween. Problems may also arise due to the difficulty of applying an adequate load to ensure that adequate socket contacts are made, in particular, for in-circuit testing or end of life minimum reliability testing.

Certain embodiments utilize a load mechanism adapted to apply a load along a majority of the surface area of the heat spreader, which provides for application of an adequate load to ensure that proper socket contacts are made for various testing procedures. In addition, the load plate is adapted to apply force to improve the flatness of the heat spreader to provide improved thermal properties and inhibit degradation of the thermal interface material between the heat spreader and the die.

Figure 1:
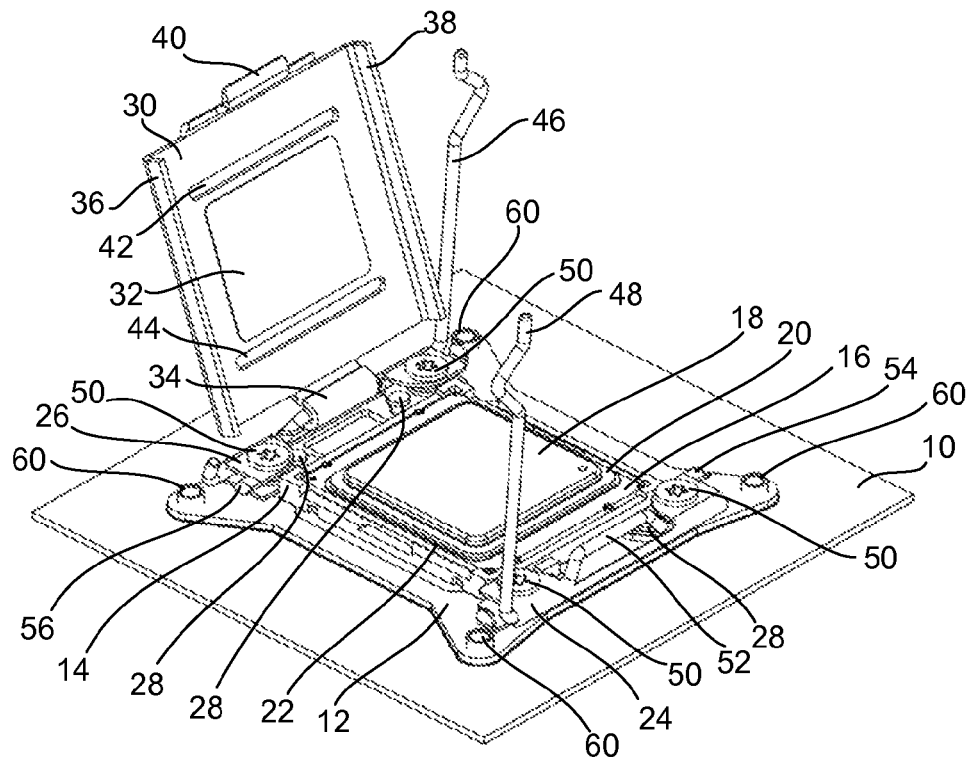
FIG. 1 is a perspective view of certain components in an assembly, including a thermal loading plate in the open position, in accordance with certain embodiments.

FIGS. 1-6 illustrate views of various components in an electronic assembly including a load plate 30, in accordance with certain embodiments. The assembly includes a circuit board 10 having a socket 14 coupled thereto. The socket 14 may be coupled to a top plate 12 that is coupled to the board 10. The socket 14 is configured with an opening into which a package is placed. The package may include a die coupled to a substrate 16. A heat spreader 18 may be positioned over the die on the substrate 16. A thermal interface material may be positioned on the die surface between the die and the heat spreader 18, to enhance thermal transport from the die to the heat spreader 18. As illustrated in FIG. 1, the heat spreader 18 may include a step-like structure, with a step 20 extending around a perimeter of the heat spreader 18. An underfill material (not shown) may be positioned between the die and the substrate 16. A seal ring 22 formed from, for example, an epoxy, may also be formed between the step 20 extending around a perimeter of the heat spreader 18 and the substrate 16.

The assembly also includes first and second frame portions 24, 26, which are used to couple the load plate 30 to the assembly. The frame portions 24, 26 may be coupled to the top plate 12 using rivets 28. Other suitable connection mechanisms may also be used. The frame portions 24, 26 are configured to support load levers 46, 48. The load levers 46, 48 are formed to be substantially L-shaped. The load lever 46 is adapted to extend through a hinge portion 34 of the load plate 30 to pivotally support the load plate 30 in the assembly. Any suitable coupling mechanism for forming a pivoting connection between the load lever 48 and the load plate 30 may be used. The load lever 48 is adapted to apply a force to the tongue region 40 of the load plate 30 when the load plate is in the closed position (see FIG. 2). The load levers 46, 48 may be formed from any suitable material, for example, a metal in the form of a rod or wire having suitable mechanical properties to permit it to be bent into the appropriate shape and be rigid enough to apply an appropriate force to the load plate 30. As illustrated in the Figures, the load levers 46, 48 include several bends for ease of use and to obtain mechanical advantage for applying force to the load plate 30. Depending on the exact configuration of the assembly components such as the socket, package, and load plate, the load levers may have a different geometry than that illustrated.

FIG. 1 illustrates the load plate 30 in an opened position. Part of the load lever 46 is positioned within the frame region 26 and extends through the hinge region 34 of the load plate. Another part of the load lever 46 extends in an upward direction when the load plate 30 is in the opened position. Part of the load lever 48 is positioned within the frame region 24. Another part of the load lever 48 extends in an upward direction and will be lowered when the load plate 30 is in the closed position so that the load lever 48 may apply a force to the tongue region 40 of the load plate 30. The force is applied to the tongue region 40 through load lever region 52 of load lever 48. The frame regions 24, 26 also include tabs 54, 56 that are configured to hold an end of the load levers 48, 46 in the closed position.

The top plate 12 may be configured so that other components in the assembly are coupled thereto. For example, the top plate 12 may be configured to accept threaded nuts 60 at locations near the corners of the top plate 12. These threaded nuts 60 may be force fit into openings in the top plate 12 and may be used to mount a heat sink 70 (see FIG. 3) to the assembly. In addition, captive nuts 50 may be positioned to coupled the frame portions 24, 26 to the assembly. The captive nuts 50 are configured to accept screws 82 that extend through a bottom plate 80 positioned on a bottom side of the board 10 (see FIG. 5), and through the board 10.

As illustrated in FIG. 1, a thermal interface material 32 may be provided on the surface of the load plate 30 that is positioned on the heat spreader 18 when the load plate 30 is closed over the package. The thermal interface material is selected to minimize thermal resistance and assist in the transfer of heat away from the heat spreader 18 and to the load plate 30. Suitable thermal interface materials include, but are not limited to, greases, gap pads, and phase change materials. The load plate may have a variety of configurations. As illustrated in FIG. 1, the load plate 30 includes sidewalls 36, 38 for added stiffness. The load plate 30 also includes slots or openings 42, 44. These slots are positioned to help control the application of force across the center of the load plate to inhibit bending at the load plate center area, to provide better thermal performance.

Figure 2:
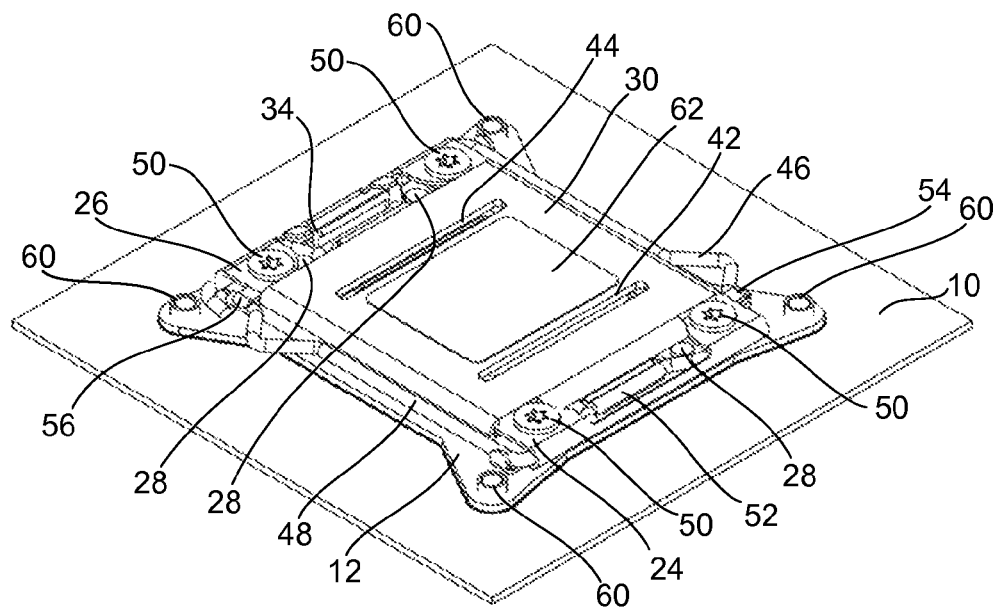
FIG. 2 is a perspective view of certain components in an assembly, including a thermal loading plate in the closed position, in accordance with certain embodiments.

FIG. 2 illustrates the assembly of FIG. 1 with the load plate 30 in a closed position on the package. The load plate 30 fits over the package in the socket 14 opening. The load application region 52 of the load lever 48 is configured to press down on the tongue 40 of the load plate 30 and apply a force thereto when the upper portion of the load lever 48 is brought into the down position on the side of the assembly, as illustrated in FIG. 2. Similarly, a region on the load lever 46 will apply a force to the hinge region 34 of the load plate 30 when the upper portion of the load lever 46 is brought into the down position on the side of the assembly. The application of force to the tongue 40 and hinge 34 regions of the load plate causes the central region of the load plate 30 to apply a force to the uppermost surface of the heat spreader 18 positioned thereunder. When in the down position as illustrated in FIG. 2, the portions of the load levers 46, 48 that were extending upward as illustrated in FIG. 1 are positioned along the sides of the assembly. An end region of the load lever 48 is positioned under tab 56, and an end region of the load lever 46 is positioned under tab 54. A thermal interface material 62 may be positioned on the upper surface of the load plate 30 as illustrated in FIG. 2. This thermal interface material 62 may be the same as the thermal interface material 32 positioned on the other side of the load plate 30. The thermal interface material 62 is provided to minimize thermal resistance and assist in the transfer of thermal energy to a heat sink 70.

Figure 3:
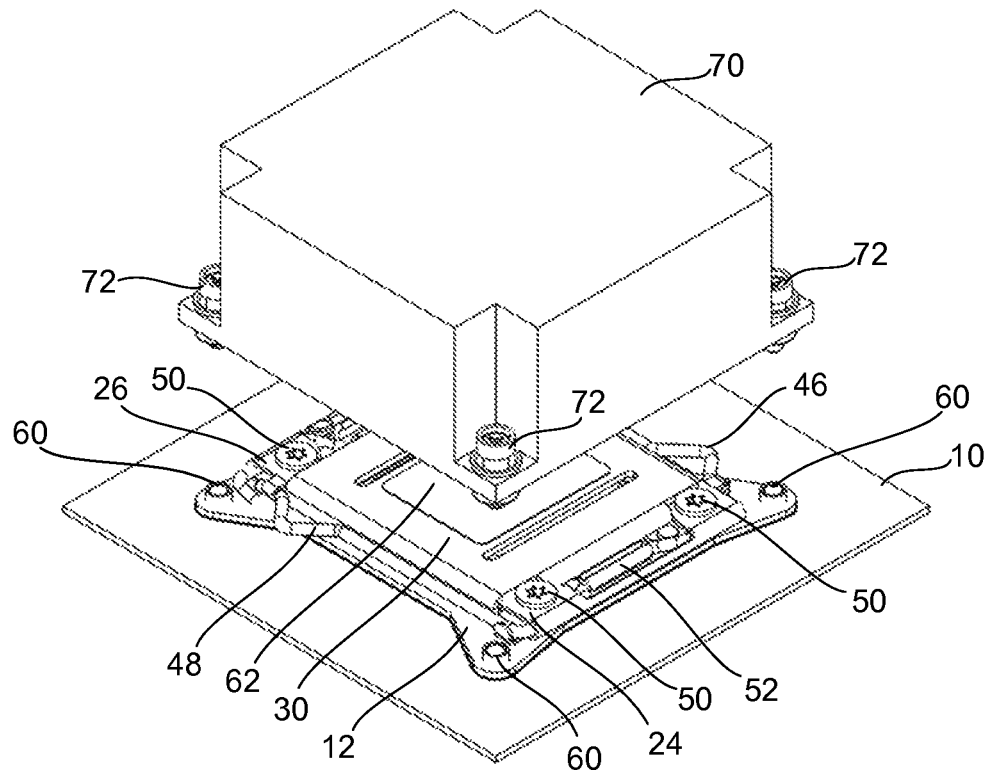
FIG. 3 is a perspective view of certain components in an assembly, including a heat sink positioned over a thermal loading plate, in accordance with certain embodiments.

FIG. 3 illustrates the assembly of FIG. 2 with a heat sink 70 positioned thereabove. The heat sink may take a variety of structures, and is not limited to the geometry and dimensions illustrated in FIG. 3. Screws 72 may be used to mount the heat sink 70 to the assembly. The screws 72 may fit into the threaded nuts 60 on the top plate 12.

Figure 4:
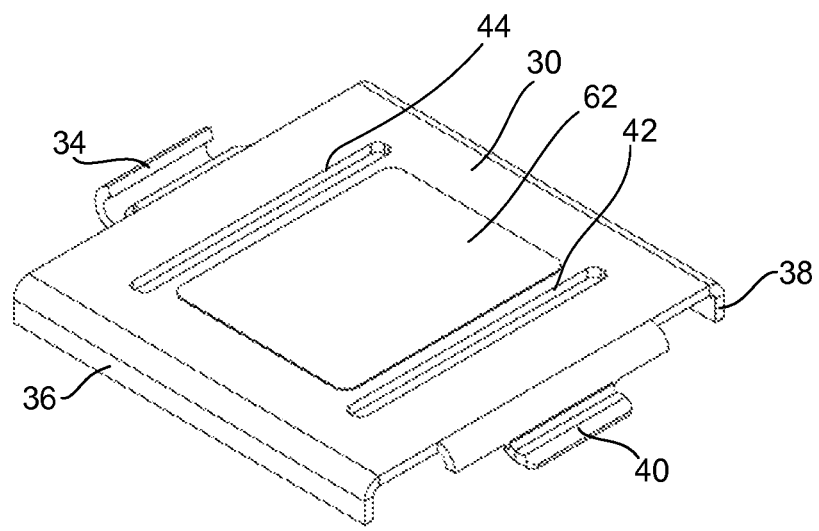
FIG. 4 is a perspective view of a thermal loading plate, in accordance with certain embodiments.
Figure 9:
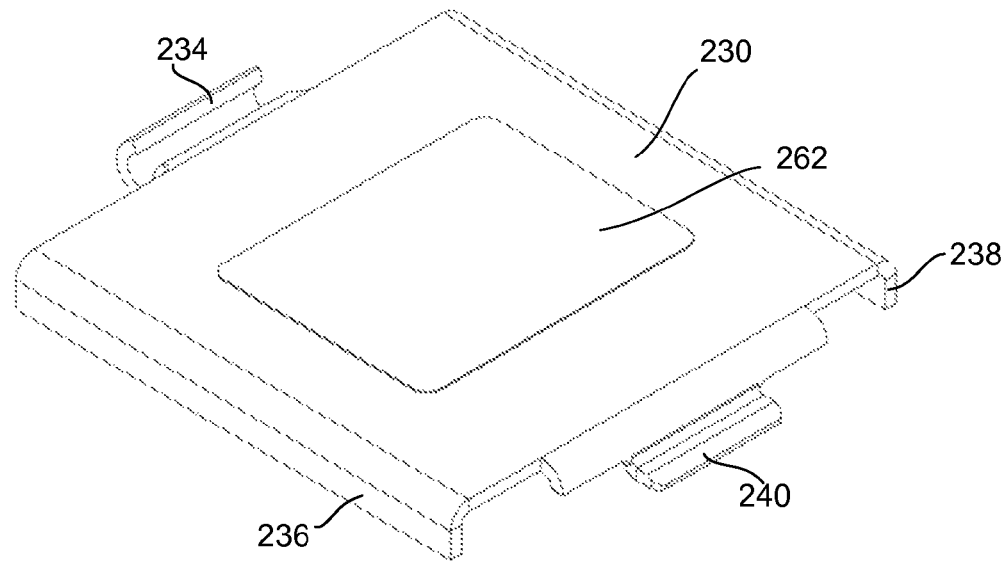
FIG. 9 illustrates a perspective view of a thermal loading plate, in accordance with certain embodiments.

FIG. 4 illustrates the load plate 30 set forth in FIGS. 1-3. The hinge region 34 and tongue region 40 are on opposite ends of the load plate 30. The sidewalls 36, 38 are also positioned on opposite ends of the load plate 30. The slots 42, 44 cut out from the load plate are configured to inhibit the bending of the central portion of the load plate 30 that applies force to the heat spreader 18 during loading, and are configured in this embodiment to be the same size and parallel to one another. Depending on factors such as, for example, the load that is applied, and the stiffness of the load plate, the slots 42, 44 may be varied in number, shape and position or may be omitted. For example, FIG. 9 illustrates an embodiment including a load plate 230 that is similar to the load plate 30 illustrated in FIG. 4, except that there are no slots in the load plate 230. Other features such as the latch 234, sidewalls 236, 238, the tongue 240, and the thermal interface material 262 are similar to those items as described above.

Certain embodiments utilize a metal for the load plate. A variety of metals may be used. Examples of suitable metals include copper and copper alloys such as a tungsten copper. Metals having relatively high thermal conductivity may be used for enhanced thermal performance. In certain embodiments, the load plate may have a thickness in the range of about 1 to 3 mm. The thickness may vary depending on factors including, but not limited to, the material of the load plate, the size of the package, the load required, the thermal properties of the package, and the size of the heat sink.

Figure 5:
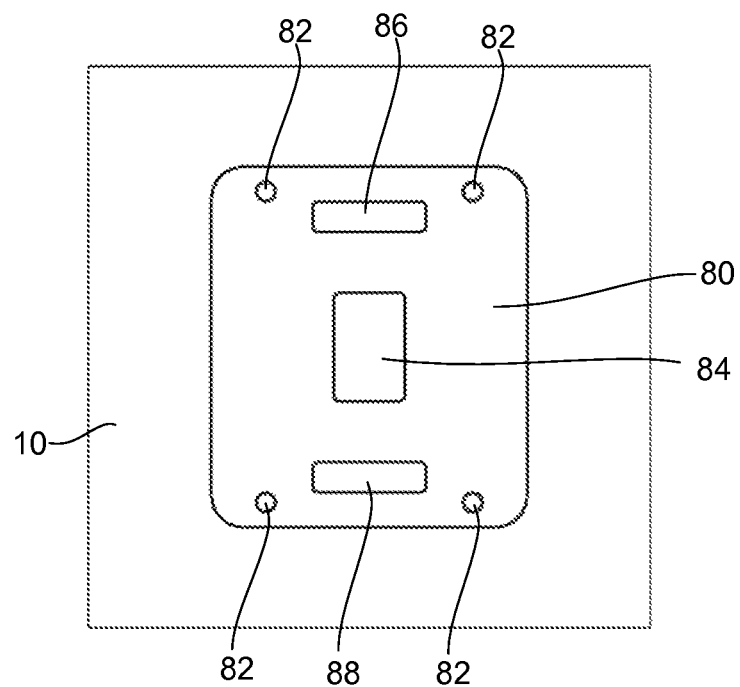
FIG. 5 is a bottom view of certain components in an assembly, in accordance with certain embodiments.

FIG. 5 illustrates a bottom view of an assembly such as that illustrated in FIGS. 1-4. A bottom plate 80 is coupled to the board 10 using screws 82, which extend through the board 10 and are engaged in the nuts 50 on the top plate 12 of the assembly. The bottom plate 80 may also include one or more openings 84, 86, 88. These openings are provided in locations where other components, if any, are coupled to the bottom of the board 10. If there are no components on the bottom of the board, then the openings 84, 86, 88 are not necessary. In certain embodiments, both the bottom plate 80 and the top plate 12 are formed from a metal. Examples of suitable metals include, but are not limited to, stainless steel and steel. As used herein, the term metal includes pure metals and alloys.

Figure 6:
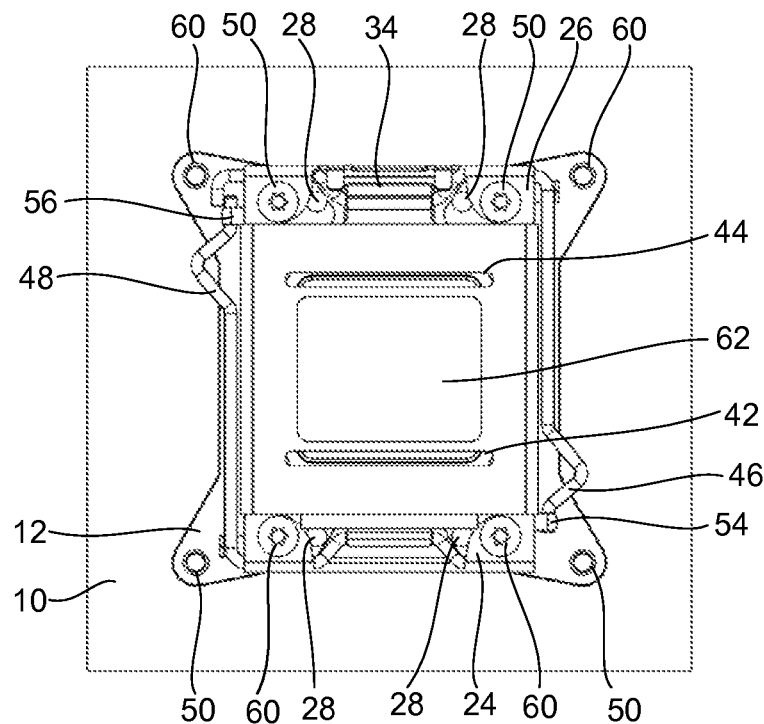
FIG. 6 is a top view of certain components in an assembly, in accordance with certain embodiments.

FIG. 6 illustrates a top view of the assembly of FIG. 2, with the load plate 30 in the closed position. The positioning of the load levers 46, 48, along the sides of the assembly, with end regions positioned under tabs 54, 56 can be readily seen.

Figure 7:
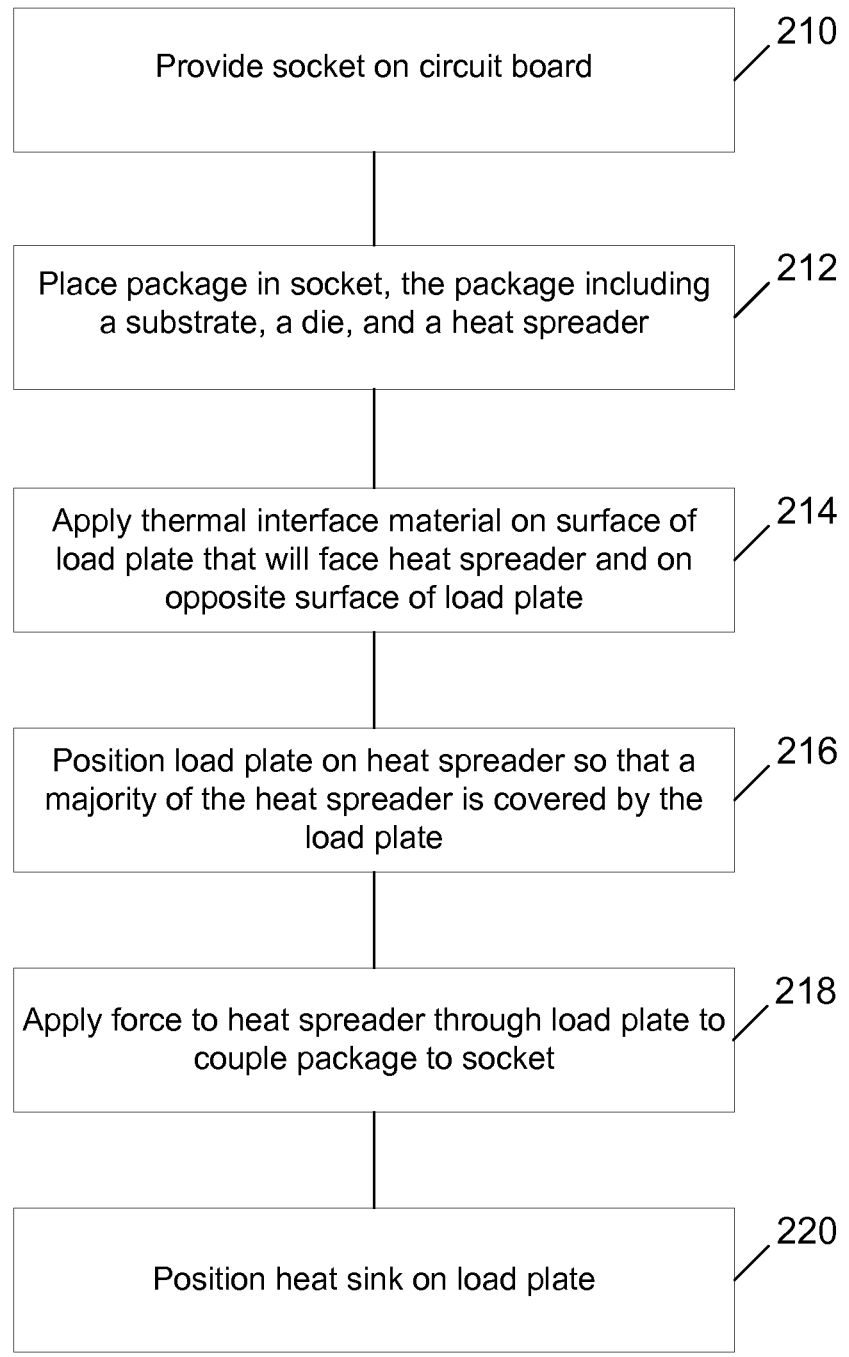
FIG. 7 illustrates a flowchart of operations, in accordance with certain embodiments.

FIG. 7 illustrates a flowchart of operations, in accordance with certain embodiments. Box 210 is providing a socket on a circuit board. Box 212 is placing a package in the socket, the package including a substrate, die, and heat spreader. Box 214 is applying a thermal interface material on the surface of a load plate that will face the heat spreader and on the opposite surface. The thermal interface material is placed on the opposite surface because a heat sink will be positioned thereon. Box 216 is positioning the load plate on the heat spreader so that a majority of the heat spreader uppermost surface is covered by the load plate. In certain embodiments, the entire uppermost surface of the heat spreader may be covered by the load plate. Box 218 is applying a force to the heat spreader through the load plate to couple the package to the socket.

Box 220 is positioning a heat sink on the load plate. It should be appreciated by one of ordinary skill that certain of the operations described above and illustrated in FIG. 7 may be optional or can be modified. For example, certain embodiments may utilize a package including additional components than those listed above.

Certain embodiments may provide one or more of the following advantages over conventional load mechanisms for applying a force to position a package in a socket. A first advantage is the ability to apply the force over a large area of the package instead of only applying the force over a perimeter region thereof. Conventional assemblies apply force to a perimeter region of the heat spreader, which requires the use of a stepped heat spreader. As packages include more and more contacts, more force is needed to ensure adequate contact between the package and socket. However, the ability to deliver a suitable amount of force to the perimeter is hindered by the available area. In addition, flatness problems arise when large loads are applied to perimeter regions of the heat spreader. Flatness problems lead to thermal degradation. As described herein, the load plate in accordance with certain embodiments is configured to apply a force over a majority of the heat spreader surface instead of just the perimeter regions. As a result, higher loads may be applied and distributed over a larger area, which provides for better contact with the socket and also improves the flatness of the assembly, which permits improved thermal transfer properties. In addition, while a stepped heat spreader is illustrated in the Figures, a heat spreader having a flat surface (with no steps) may also be utilized.

Numerous modifications may be made to the features shown in the Figures. The structures (substrate, die, heat spreader) positioned in the socket are not limited to the configuration described and illustrated above. Other types of components may also be utilized, and the orientation may be modified. For example, certain package structures may have a substrate as the uppermost component that will be contacted by the load plate. In addition, multiple die structures and heat spreading structures may also be present in the package. A variety of components in addition to those illustrated in the Figures and described above may be used. The load plate may have a variety of configurations, depending on the factors including, but not limited to, the size and shape of the package, the number of contacts, the required load, and the thermal properties of the package. The load plate may in certain embodiments cover the entire surface of the heat spreader, and in other embodiment cover a majority of the heat spreader but not the entire surface thereof. Also, the load plate may include one or more openings therein such as the slots 42, 44. The shape, size, and position of the openings may vary, with the openings, if present, being positioned either a distance away from the upper surface of the heat spreader or being positioned over a portion of the upper surface of the heat spreader. In addition, other types of coupling mechanisms for the various components may be utilized.

Figure 8:
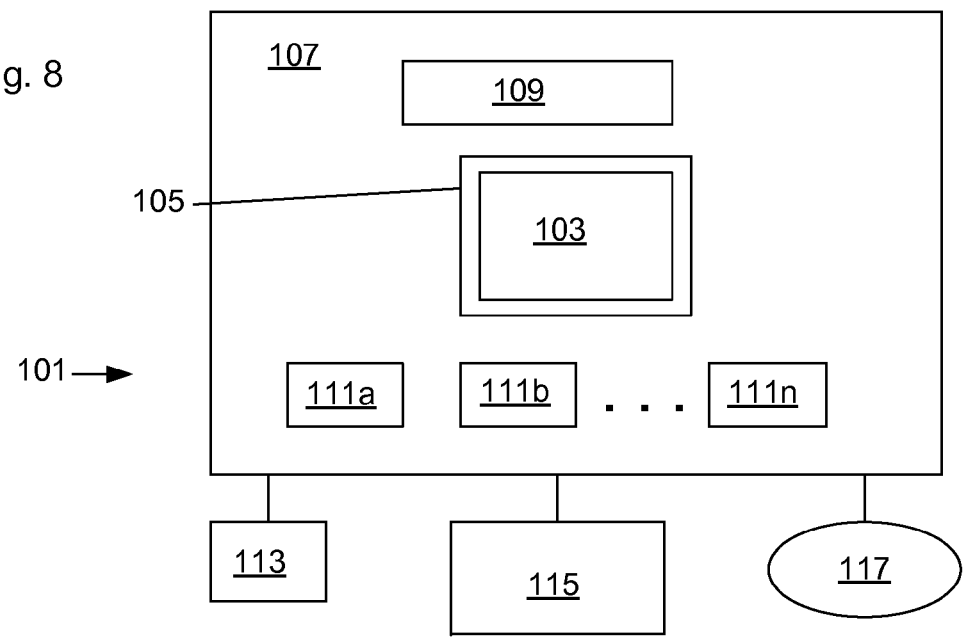
FIG. 8 illustrates an electronic system arrangement in which embodiments may find application.

Assemblies such as those described above may find application in a variety of electronic components. FIG. 8 schematically illustrates one example of an electronic system environment in which aspects of described embodiments may be embodied. Other embodiments need not include all of the features specified in FIG. 8, and may include alternative features not specified in FIG. 8.

The system 101 of FIG. 8 may include at least one central processing unit (CPU) 103. The CPU 103, also referred to as a microprocessor, may be a semiconductor die which is attached to a package substrate 105, and may also include a heat spreader positioned thereon, and is coupled to a printed circuit board 107, which in this embodiment, may be a motherboard. This is an example of an electronic device which may be coupled to a socket on the printed circuit board 107 in accordance with embodiments as described herein. A variety of other system components, including, but not limited to memory and other components discussed below, may also be coupled to structures in accordance with the embodiments described above.

The system 101 may further include memory 109 and one or more controllers 111*a*, 111*b* . . . 111*n*, which are also disposed on the motherboard 107. The motherboard 107 may be a single layer or multi-layered board which has a plurality of conductive lines that provide communication between the circuits in the package 105 and other components mounted to the board 107. Alternatively, one or more of the CPU 103, memory 109 and controllers 111*a*, 111*b* . . . 111*n* may be disposed on other cards such as daughter cards or expansion cards. The CPU 103, memory 109 and controllers 111*a*, 111*b* . . . 111*n* may each be seated in individual sockets or may be connected directly to a printed circuit board. A display 115 may also be included.

Any suitable operating system and various applications execute on the CPU 103 and reside in the memory 109. The content residing in memory 109 may be cached in accordance with known caching techniques. Programs and data in memory 109 may be swapped into storage 113 as part of memory management operations. The system 101 may comprise any suitable computing device, including, but not limited to, a mainframe, server, personal computer, workstation, laptop, handheld computer, netbook, tablet, book reader, handheld gaming device, handheld entertainment device (for example, MP3 (moving picture experts group layer—3 audio) player), PDA (personal digital assistant) telephony device (wireless or wired), network appliance, virtualization device, storage controller, network controller, router, etc.

The controllers 111*a*, 111*b* . . . 111*n* may include one or more of a system controller, peripheral controller, memory controller, hub controller, I/O (input/output) bus controller, video controller, network controller, storage controller, communications controller, etc. For example, a storage controller can control the reading of data from and the writing of data to the storage 113 in accordance with a storage protocol layer. The storage protocol of the layer may be any of a number of known storage protocols. Data being written to or read from the storage 113 may be cached in accordance with known caching techniques. A network controller can include one or more protocol layers to send and receive network packets to and from remote devices over a network 117. The network 117 may comprise a Local Area Network (LAN), the Internet, a Wide Area Network (WAN), Storage Area Network (SAN), etc. Embodiments may be configured to transmit and receive data over a wireless network or connection. In certain embodiments, the network controller and various protocol layers may employ the Ethernet protocol over unshielded twisted pair cable, token ring protocol, Fibre Channel protocol, etc., or any other suitable network communication protocol.

Terms such as "first", "second", and the like as used herein to not necessarily denote any particular order, quantity, or importance, but are used to distinguish one element from another. Terms such as "upper", "uppermost", "lower", and the like as used herein refer to the orientation of features as illustrated in the attached figures.

While certain exemplary embodiments have been described above and shown in the accompanying drawings, it is to be understood that such embodiments are merely illustrative and not restrictive, and that embodiments are not restricted to the specific constructions and arrangements shown and described since modifications to the structures and methods described herein may occur to those having ordinary skill in the art.

What is claimed:

1. An assembly for use with a package, comprising:
   a circuit board;
   a socket coupled to the circuit board, the socket sized to contain the package therein; and
   a hinged load plate adapted to be positioned in a position selected from the group consisting of opened and closed, the load plate being sized to cover an uppermost surface of the package when positioned in a closed position, the load plate including a plurality of sidewalls extending downward from a main portion thereof, the load plate including first and second slots extending therethrough, the first and second slots positioned offset from the uppermost surface of the package, the first and second slots each having a length that is greater than a length of the uppermost surface of the package.

2. The assembly of claim 1, further comprising the package positioned in the socket, wherein the package comprises a substrate, a die, and a heat spreader, wherein the uppermost surface is defined by the heat spreader.

3. The assembly of claim 2, further comprising a heat sink positioned on the load plate, the load plate positioned between the heat spreader and the heat sink.

4. The assembly of claim 3, further comprising a thermal interface material between the heat spreader and the load plate and between the load plate and the heat sink.

5. The assembly of claim 1, further comprising a bottom plate, wherein the circuit board is positioned between the bottom plate and the socket, and wherein the bottom plate includes a first plurality of openings through which the bottom plate is coupled to a bottom surface of the circuit board, and a second plurality of openings adapted to permit the mounting of components to the bottom surface of the circuit board.

6. The assembly of claim 1, wherein the first slot is equal in size to the second slot.

7. An assembly comprising:
   a circuit board;
   a socket coupled to the circuit board;
   a package positioned in the socket, the package including a substrate, a die, and a heat spreader, the die positioned between the substrate and the heat spreader;
   a hinged load plate adapted to be positioned on the heat spreader, the load plate covering an uppermost surface of the heat spreader when positioned in a closed position, the load plate applying a force to the heat spreader that couples the package to the socket when in the closed position, the load plate including first and second slots extending therethrough, the first and second slots each having a length that is greater than a length of the uppermost surface of the heat spreader, the first and second slots being positioned offset from the uppermost surface of the heat spreader; and
   a thermal interface material positioned between the heat spreader and the load plate.

8. The assembly of claim 7, wherein the heat spreader includes a stepped structure extending outward from the uppermost surface.

9. The assembly of claim 7, wherein the first and second slots are positioned parallel to one another, and wherein the first slot is equal in size to the second slot.

10. The assembly of claim 7, further comprising a heat sink on the load plate, the load plate positioned between the heat spreader and the heat sink.

11. The assembly of claim 10, including a thermal interface material positioned between the load plate and the heat sink.

12. The assembly of claim 11, wherein the thermal interface material positioned between the heat spreader and the load plate has the same composition as the thermal interface material positioned between the load plate and the heat sink.

13. The assembly of claim 7, wherein the load plate comprises at least one material selected from the group consisting of copper and tungsten.

14. The assembly of claim 7, further comprising first and second loads levers coupled to the circuit board, the first load lever adapted to engage a first portion of the load plate, the second load lever adapted to engage a second portion of the load plate.

15. The assembly of claim 7, further comprising a bottom plate, wherein the circuit board is positioned between the bottom plate and the socket, and wherein the bottom plate includes a first plurality of openings through which the bottom plate is coupled to a bottom surface of the circuit board, and a second plurality of openings adapted to permit the mounting of components to the bottom surface of the circuit board.

16. The assembly of claim 7, wherein the thermal interface material comprises a phase change material.

17. A method comprising:
    providing a socket on a first surface of a circuit board;
    providing a package in the socket, the package including a substrate, a die, and a heat spreader, the die positioned between the substrate and the heat spreader;
    providing a hinged load plate coupled to the circuit board, the load plate adapted to extend across an uppermost surface of the heat spreader when positioned in a closed position thereon;
    providing a thermal interface material between the heat spreader and the load plate;
    positioning the load plate onto the uppermost surface of the heat spreader so that the load plate applies a force to the heat spreader;
    after the positioning the load plate, positioning a heat sink on the load plate, the load plate positioned between the heat spreader and the heat sink;
    positioning a thermal interface material between the load plate and the heat sink; and
    positioning a plate on a second surface of the circuit board opposite the first surface, and coupling a component to the second surface of the circuit board through an opening in the plate.

18. The method of claim 17, further comprising forming the load plate to include first and second slots, the first and second slots positioned offset from the uppermost surface of the heat spreader.

19. The method of claim 18, further comprising forming the first and second slots to each include a length that is greater than a length of the uppermost surface of the heat spreader.

20. The method of claim 19, further comprising forming the first slot and the second slot to be equal in size.

* * * * *